United States Patent
Sakakibara et al.

(10) Patent No.: US 8,907,680 B2
(45) Date of Patent: Dec. 9, 2014

(54) VOLTAGE DETECTOR, MALFUNCTION DETECTING DEVICE, CONTACTLESS POWER TRANSMITTING DEVICE, CONTACTLESS POWER RECEIVING DEVICE, AND VEHICLE

(75) Inventors: Hiroyuki Sakakibara, Hekinan (JP); Shinji Ichikawa, Toyota (JP)

(73) Assignees: Nippon Soken, Inc., Nishio-shi (JP); Toyota Jidosha Kabushiki Kaisha, Toyota (JP)

( * ) Notice: Subject to any disclaimer, the term of this patent is extended or adjusted under 35 U.S.C. 154(b) by 253 days.

(21) Appl. No.: 13/576,525

(22) PCT Filed: May 27, 2010

(86) PCT No.: PCT/JP2010/058974
§ 371 (c)(1),
(2), (4) Date: Aug. 1, 2012

(87) PCT Pub. No.: WO2011/121800
PCT Pub. Date: Oct. 6, 2011

(65) Prior Publication Data
US 2013/0009650 A1      Jan. 10, 2013

(30) Foreign Application Priority Data
Mar. 30, 2010    (JP) ................................ 2010-078236

(51) Int. Cl.
*G01R 31/06*        (2006.01)
*G06F 12/00*        (2006.01)
(Continued)

(52) U.S. Cl.
CPC . *G06F 12/00* (2013.01); *B60L 3/00* (2013.01); *B60L 11/005* (2013.01); *B60L 11/14* (2013.01);
(Continued)

(58) Field of Classification Search
CPC ........ G01R 31/06; G01R 19/155; H02J 7/025
USPC .......... 324/713, 546, 207.11, 207.12, 207.15,
324/246, 239, 243, 256, 257; 343/732, 719,
343/741, 742; 320/108; 455/41.1, 80–83,
455/562.1, 575.7, 107, 129
See application file for complete search history.

(56) References Cited

U.S. PATENT DOCUMENTS 6,547,786 B1    4/2003  Goble
6,639,401 B2 *  10/2003  Li et al. ......................... 324/239
(Continued)

FOREIGN PATENT DOCUMENTS

CN          1274566 A       11/2000
JP          A-07-007845      1/1995
(Continued)

*Primary Examiner* — Patrick Assouad
*Assistant Examiner* — Lamarr Brown
(74) *Attorney, Agent, or Firm* — Oliff PLC

(57) ABSTRACT

A voltage detector for detecting a voltage generated in a second resonant coil that is disposed to face a first resonant coil and that performs at least one of electric power transmission and electric power reception to and from the first resonant coil in a contactless manner by means of electromagnetic resonance includes: a first high-impedance element having one end connected to one end of the second resonant coil; a second high-impedance element having one end connected to the other end of the second resonant coil; a low-impedance element connected between the other end of the first high-impedance element and the other end of the second high-impedance element and having an impedance smaller than each of those of the first and second high-impedance elements; and an output terminal for outputting a signal associated with a voltage applied across the low-impedance element.

14 Claims, 6 Drawing Sheets

(51) Int. Cl.
  *B60L 3/00* (2006.01)
  *B60L 11/00* (2006.01)
  *B60L 11/14* (2006.01)
  *B60L 11/18* (2006.01)
  *H02J 17/00* (2006.01)
  *H02M 3/335* (2006.01)
  *H02J 7/00* (2006.01)
  *H02J 7/02* (2006.01)
  *H02J 7/04* (2006.01)

(52) U.S. Cl.
  CPC ............... *B60L 11/18* (2013.01); *B60L 11/182* (2013.01); *H02J 17/00* (2013.01); *H02M 3/33561* (2013.01); *B60L 3/0023* (2013.01); *B60L 11/1833* (2013.01); *B60L 11/1887* (2013.01); *H02J 7/00* (2013.01); *H02J 7/025* (2013.01); *H02J 7/027* (2013.01); *H02J 7/047* (2013.01); *G01R 31/06* (2013.01); *B60L 2240/36* (2013.01); *B60L 2250/10* (2013.01); *Y02T 10/7022* (2013.01); *Y02T 10/7077* (2013.01); *Y02T 10/7088* (2013.01); *Y02T 90/122* (2013.01); *Y02T 90/127* (2013.01); *Y02T 90/14* (2013.01); *B60L 2210/10* (2013.01); *B60L 2210/30* (2013.01); *B60L 2210/40* (2013.01); *B60L 2240/662* (2013.01); *B60L 2240/527* (2013.01); *Y02T 10/7241* (2013.01); *Y02T 90/16* (2013.01); *Y02T 90/125* (2013.01); *Y02T 90/12* (2013.01); *Y02T 10/7216* (2013.01); *Y02T 90/34* (2013.01); *H02J 2007/0096* (2013.01)
  USPC .. 324/546; 324/713; 324/207.11; 324/207.12; 324/207.15; 324/246; 324/239; 324/243; 324/256; 324/257; 343/719; 343/741; 343/742; 343/732; 455/41.1; 455/80; 455/81; 455/82; 455/83; 455/562.1; 455/575.7; 455/107; 455/129; 320/108

(56) References Cited

U.S. PATENT DOCUMENTS

| | | | |
|---|---|---|---|
| 8,008,888 B2 * | 8/2011 | Oyobe et al. | 320/108 |
| 8,178,995 B2 * | 5/2012 | Amano et al. | 307/9.1 |
| 2007/0131505 A1 * | 6/2007 | Kim | 191/14 |
| 2009/0045773 A1 * | 2/2009 | Pandya et al. | 320/108 |
| 2009/0184680 A1 * | 7/2009 | Kao et al. | 320/108 |
| 2009/0278523 A1 | 11/2009 | Yoda et al. | |
| 2010/0020457 A1 * | 1/2010 | Kojovic et al. | 361/93.2 |
| 2010/0065352 A1 * | 3/2010 | Ichikawa | 180/65.8 |
| 2010/0072946 A1 * | 3/2010 | Sugano | 320/108 |
| 2010/0117596 A1 * | 5/2010 | Cook et al. | 320/108 |
| 2010/0225271 A1 | 9/2010 | Oyobe et al. | |
| 2010/0320963 A1 * | 12/2010 | Cheng et al. | 320/108 |
| 2011/0074346 A1 * | 3/2011 | Hall et al. | 320/108 |
| 2011/0084658 A1 * | 4/2011 | Yamamoto et al. | 320/108 |
| 2011/0121778 A1 * | 5/2011 | Oyobe et al. | 320/108 |
| 2011/0148351 A1 * | 6/2011 | Ichikawa | 320/108 |
| 2011/0163542 A1 * | 7/2011 | Farkas | 290/2 |
| 2011/0181240 A1 * | 7/2011 | Baarman et al. | 320/108 |
| 2011/0254503 A1 * | 10/2011 | Widmer et al. | 320/108 |
| 2011/0276208 A1 * | 11/2011 | Sasaki | 701/22 |
| 2011/0285349 A1 * | 11/2011 | Widmer et al. | 320/108 |
| 2011/0291615 A1 * | 12/2011 | Pandya et al. | 320/108 |

FOREIGN PATENT DOCUMENTS

| | | |
|---|---|---|
| JP | A-11-164497 | 6/1999 |
| JP | A-2009-106136 | 5/2009 |
| WO | WO 2009/054221 A1 | 4/2009 |

* cited by examiner

STRENGTH OF
ELECTROMAGNETIC
FIELD

DISTANCE FROM ELECTRIC CURRENT SOURCE
(MAGNETIC CURRENT SOURCE)

VOLTAGE DETECTOR, MALFUNCTION DETECTING DEVICE, CONTACTLESS POWER TRANSMITTING DEVICE, CONTACTLESS POWER RECEIVING DEVICE, AND VEHICLE

TECHNICAL FIELD

The present invention relates to a voltage detector, a malfunction detecting device, a contactless power transmitting device, a contactless power receiving device, and a vehicle, more particularly, detection of a malfunction in a resonant coil used for contactless power supply in a resonance method.

BACKGROUND ART

As environmentally friendly vehicles, vehicles such as electric vehicles and hybrid vehicles are drawing significant attention. Each of such vehicles includes: a motor for generating driving power for traveling; and a rechargeable power storage device storing electric power to be supplied to the motor. It should be noted that the hybrid vehicles include: a vehicle including an internal combustion engine in addition to the motor as a motive power source; a vehicle including a fuel cell in addition to the power storage device as a direct-current power source for driving the vehicle; and the like.

As with the electric vehicles, there has been also known a hybrid vehicle chargeable from an external power source to the power storage device of the vehicle. For example, a so-called "plug-in hybrid vehicle" has been known which is adapted such that its power storage device can be charged from a power source in a general house by connecting a power receptacle of the house to a charging inlet of the vehicle via a charging cable.

Meanwhile, wireless power transmission has been drawing attention recently as a method for transmitting electric power. The wireless power transmission does not employ a power cord or a power transmission cable. The following three known wireless power transmission techniques are promising: power transmission employing electromagnetic induction; power transmission employing electromagnetic wave; and power transmission employing a resonance method.

Among these, the resonance method is a contactless power transmission technique in which a pair of resonators (for example, a pair of resonant coils) are resonated with each other in an electromagnetic field (near field) to transmit electric power via the electromagnetic field. With the resonance method, a large electric power of several kW can be transmitted in a relatively long distance (for example, several meters). Because the large electric power is generated in the resonant coils in the resonance method, a demand arises in detecting a malfunction of such resonant coils in order to prevent failure of the system due to heat generation or the like.

Japanese Patent Laying-Open No. 11-164497 (PTL 1) discloses a technique of stopping supply of electric power to a circuit in response to a malfunction, which is identified when a pickup coil's temperature detected by a temperature sensor exceeds a certain value in a contactless power supply device that employs electromagnetic induction.

CITATION LIST

Patent Literature

PTL 1: Japanese Patent Laying-Open No. 11-164497
PTL 2: Japanese Patent Laying-Open No, 2009-106136

SUMMARY OF INVENTION

Technical Problem

In the contactless power supply employing the resonance method, electric power is transmitted by resonating the resonant coils included in the power transmitting device and the power receiving device. In order to improve efficiency in transmitting electric power, a Q value for the resonant coils in the power transmitting device and the power receiving device needs to be large.

In the case where a contact type temperature sensor such as a thermistor or a thermocouple is used to detect a malfunction in each of the resonant coils, the temperature sensor making contact with the resonant coil causes a current to flow through a parasitic capacitance between the resonant coil and the temperature sensor. Accordingly, the Q value for resonance is decreased to possibly result in decreased transmission efficiency.

Although a contactless temperature detecting technique using an optical fiber, a laser, or the like can be employed, such temperature sensors are generally expensive and therefore can result in increased cost.

The present invention has been made to solve such a problem, and has its object to detect a malfunction of each of resonant coils in a contactless power supply system that employs the resonance method, while suppressing an influence over a resonance state between the resonant coils and suppressing increase of cost.

Solution to Problem

A voltage detector according to the present invention is a voltage detector for detecting a voltage generated in a second resonant coil that is disposed to face a first resonant coil and that performs at least one of electric power transmission and electric power reception to and from the first resonant coil in a contactless manner by means of electromagnetic resonance. The voltage detector includes first and second high-impedance elements, a low-impedance element, and an output terminal. The first high-impedance element has one end connected to one end of the second resonant coil. The second high-impedance element has one end connected to the other end of the second resonant coil. The low-impedance element is connected between the other end of the first high-impedance element and the other end of the second high-impedance element and has an impedance smaller than each of those of the first and second high-impedance elements. The output terminal outputs a signal associated with a voltage applied across the low-impedance element.

Preferably, the first high-impedance element includes a first capacitor, and the second high-impedance element includes a second capacitor.

Preferably, each of the first and second capacitors includes: an electrode for achieving connection to the second resonant coil; and a dielectric member whose length in an electric field direction is larger than that of the electrode in a direction perpendicular to the electric field direction.

Preferably, the length of the dielectric member in the electric field direction is a length that allows an impedance of the voltage detector to be greater than a predetermined value large enough to have no influence over a resonance state between the first and second resonant coils, the impedance of the voltage detector being generated by connecting the first and second capacitors to the second resonant coil.

Preferably, capacitances of the first and second capacitors are set to be substantially equal to each other.

Preferably, the low-impedance element is an isolation transformer. The isolation transformer includes: a primary coil connected between the respective other ends of the first and second high-impedance elements; a secondary coil connected to the output terminal; and a toroidal core around which the primary coil and the secondary coil are wound.

Preferably, the voltage detector further includes a shield box for shielding an electromagnetic field generated from the second resonant coil. The isolation transformer is disposed in the shield box.

Preferably, each of the first and second high-impedance elements includes an electrode for achieving connection to the second resonant coil. The first and second high-impedance elements and the low-impedance element are arranged such that impedances respectively connected to the electrodes are symmetrical to each other.

A malfunction detecting device according to the present invention includes: one voltage detector of those described above; and a malfunction determining unit configured to determine a malfunction in the second resonant coil, based on the signal associated with the voltage and output from the voltage detector.

Preferably, when the signal associated with the voltage is greater than a reference value, the malfunction determining unit determines that the second resonant coil has a high temperature.

Preferably, the malfunction determining unit determines whether or not loss in the second resonant coil is increased, based on a comparison between the signal associated with the voltage and a voltage of the electric power supplied to the second resonant coil.

Preferably, the malfunction detecting device further includes an alarm outputting unit for outputting an alarm to an operator when the malfunction in the second resonant coil is detected.

A contactless power transmitting device according to the present invention includes a resonant coil for establishing electromagnetic resonance with a power receiving device, an electromagnetic induction coil, a voltage detector, and a malfunction determining unit, and transfers electric power from an power source to the power receiving device in a contactless manner by means of electromagnetic resonance. The electromagnetic induction coil transfers the electric power from the power source to the resonant coil by means of electromagnetic induction. The voltage detector detects a voltage generated in the resonant coil. The malfunction determining unit detects a malfunction in the resonant coil based on a signal associated with a voltage and output from the voltage detector. The voltage detector includes first and second high-impedance elements, a low-impedance element, and an output terminal. The first high-impedance element has one end connected to one end of the resonant coil. The second high-impedance element has one end connected to the other end of the resonant coil. The low-impedance element is connected between the other end of the first high-impedance element and the other end of the second high-impedance element and has an impedance smaller than each of those of the first and second high-impedance elements. The output terminal outputs the signal associated with the voltage applied across the low-impedance element.

A contactless power receiving device according to the present invention includes a resonant coil for establishing electromagnetic resonance with a power transmitting device, an electromagnetic induction coil, a voltage detector, and a malfunction determining unit, and receives electric power from the power transmitting device in a contactless manner by means of electromagnetic resonance. The electromagnetic induction coil extracts the electric power received by the resonant coil, by means of electromagnetic induction. The voltage detector detects a voltage generated in the resonant coil. The malfunction determining unit detects a malfunction in the resonant coil based on a signal associated with the voltage and output from the voltage detector. The voltage detector includes first and second high-impedance elements, a low-impedance element, and an output terminal. The first high-impedance element has one end connected to one end of the resonant coil. The second high-impedance element has one end connected to the other end of the resonant coil. The low-impedance element is connected between the other end of the first high-impedance element and the other end of the second high-impedance element and has an impedance smaller than each of those of the first and second high-impedance elements. The output terminal outputs the signal associated with the voltage applied across the low-impedance element.

A vehicle according to the present invention includes a contactless power receiving device, a power storage device, and a driving device. The contactless power receiving device receives electric power from a power transmitting device in a contactless manner by means of electromagnetic resonance. The power storage device is capable of being charged using the electric power received by the contactless power receiving device. The driving device generates driving power for traveling of the vehicle using the electric power from the power storage device. The contactless power receiving device includes a resonant coil for establishing electromagnetic resonance with the power transmitting device, an electromagnetic induction coil, a voltage detector, and a malfunction determining unit. The electromagnetic induction coil extracts electric power received by the resonant coil, by means of electromagnetic induction. The voltage detector detects a voltage generated in the resonant coil. The malfunction determining unit detects a malfunction in the resonant coil, based on a signal associated with the voltage and output from the voltage detector. The voltage detector includes first and second high-impedance elements, a low-impedance element, and an output terminal. The first high-impedance element has one end connected to one end of the resonant coil. The second high-impedance element has one end connected to the other end of the resonant coil. The low-impedance element is connected between the other end of the first high-impedance element and the other end of the second high-impedance element and has an impedance smaller than each of those of the first and second high-impedance elements. The output terminal outputs the signal associated with the voltage applied across the low-impedance element.

Advantageous Effects of Invention

According to the present invention, a malfunction in each of the resonant coils can be detected while suppressing an influence over the resonance state between the resonant coils and suppressing increase of cost in the contactless power supply system that employs the resonance method.

DESCRIPTION OF EMBODIMENTS

Figure 1:
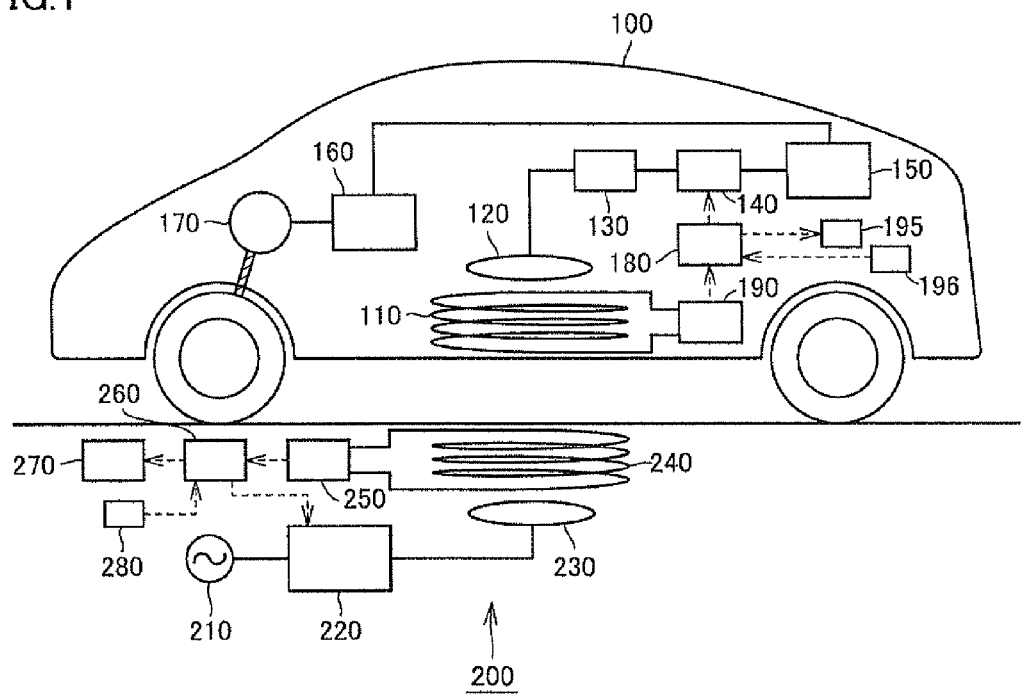
FIG. 1 is an entire configuration diagram of a contactless power supply system according to an embodiment of the present invention.

The following describes an embodiment of the present invention in detail with reference to figures. It should be noted that the same or corresponding portions in the figures are given the same reference characters and are not described repeatedly.

FIG. 1 is an entire configuration diagram of a contactless power supply system according to the embodiment of the present invention. Referring to FIG. 1, the contactless power supply system includes a vehicle 100 and a power supply device 200.

Vehicle 100 includes a secondary resonant coil 110, a secondary electromagnetic induction coil 120, a rectifier 130, a DC/DC converter 140, a power storage device 150, a power control unit (hereinafter, also referred to as "PCU") 160, a motor 170, a vehicular ECU (Electronic Control Unit) 180, a voltage detector 190, an alarming device 195, and a temperature sensor 196.

It should be noted that the configuration of vehicle 100 is not limited to the configuration of FIG. 1 as long as the vehicle is driven by a motor. Examples of vehicle 100 may include a hybrid vehicle including a motor and an internal combustion engine, a fuel cell vehicle including a fuel cell, an electric vehicle, and the like.

Secondary resonant coil 110 is provided at a lower portion of the vehicular body, for example. Secondary resonant coil 110 is an LC resonant coil whose both ends are open (connectionless), and is resonated with a primary resonant coil 240 of power supply device 200 via an electromagnetic field, thereby receiving electric power from power supply device 200. It should be noted that the capacitance component of secondary resonant coil 110 is a parasitic capacitance of the coil, but an additional capacitor (not shown) may be connected across the coil in order to obtain a predetermined capacitance.

The number of winding of secondary resonant coil 110 is appropriately set based on a distance to primary resonant coil 240 of power supply device 200, resonance frequencies of primary resonant coil 240 and secondary resonant coil 110, and the like, so as to obtain a large Q value (for example, Q>100), a large value of κ, and the like. The Q value represents resonance strength between primary resonant coil 240 and secondary resonant coil 110, and κ represents a degree of coupling therebetween.

Secondary electromagnetic induction coil 120 is provided coaxial to secondary resonant coil 110, and can be magnetically coupled to secondary resonant coil 110 by means of electromagnetic induction. This secondary electromagnetic induction coil 120 employs electromagnetic induction to extract the electric power received by secondary resonant coil 110, and sends it to rectifier 130.

Rectifier 130 rectifies the alternating-current power thus extracted by secondary electromagnetic induction coil 120, into direct-current power, which is then sent to DC/DC converter 140. Based on a control signal from vehicular ECU 180, DC/DC converter 140 converts the electric power rectified by rectifier 130, so as to attain a voltage level for power storage device 150, and then sends it to power storage device 150. In the case of receiving electric power from power supply device 200 while traveling the vehicle, DC/DC converter 140 may convert the direct-current voltage rectified by rectifier 130 into a system voltage, and may directly supply it to PCU 160. Further, DC/DC converter 140 is not necessarily required. The alternating-current power extracted by secondary electromagnetic induction coil 120 may be directly supplied to power storage device 150 after being rectified by rectifier 130.

Power storage device 150 is a rechargeable direct-current power source, and is configured to include a secondary battery such as a lithium ion battery or a nickel hydrogen battery. Power storage device 150 stores electric power supplied from DC/DC converter 140, and also stores regenerative electric power generated by motor 170. Power storage device 150 supplies the stored electric power to PCU 160. It should be noted that a capacitor having a large capacitance can be also employed as power storage device 150. Any power storage device 150 can be employed as long as it is an electric power buffer capable of temporarily storing the electric power supplied from power supply device 200 and the regenerative electric power from motor 170, and capable of supplying the stored electric power to PCU 160.

Using the electric power output from power storage device 150 or the electric power directly supplied from DC/DC converter 140, PCU 160 drives motor 170. Further, PCU 160 converts the regenerative electric power (alternating-current power) generated by motor 170 into direct-current power and outputs it to power storage device 150 so as to charge power storage device 150. Motor 170 is driven by PCU 160, generates driving power for vehicle traveling, and outputs it to driving wheels. Further, motor 170 generates electric power using kinetic energy received from the driving wheels or an engine not shown in the figure and provided in the case of a hybrid vehicle, and sends the generated regenerative electric power to PCU 160.

Voltage detector 190 is connected to secondary resonant coil 110. Voltage detector 190 detects a voltage generated in secondary resonant coil 110, and sends a detection value thereof to vehicular ECU 180. Details of the configuration of voltage detector 190 will be described below with reference to FIG. 6.

Although not shown in FIG. 1, vehicular ECU 180 includes a CPU (Central Processing Unit), a memory device, and an input/output buffer, so as to receive signals from sensors, send control signals to devices, and control vehicle 100 and the devices. Further, vehicular ECU 180 is configured to be capable of communicating with a below-described power transmission ECU 260 of power supply device 200 in a wireless manner or the like. It should be noted that processing for these controls is not limited to software processing, and can be implemented by dedicated hardware (electronic circuit). It should be also noted that in FIG. 1, vehicular ECU 180 is configured to perform both the traveling control of vehicle 100 and the power receiving control for receiving the electric power from power supply device 200, but the configuration of the control device is not limited to this. Namely, vehicle 100 can be configured to include control devices individually corresponding to devices or functions. For example, vehicle 100 may be configured to include a power receiving ECU for mainly performing the power receiving control.

Vehicular ECU 180 controls DC/DC converter 140 during supply of electric power from power supply device 200 to vehicle 100. For example, vehicular ECU 180 controls DC/DC converter 140 to control a voltage between rectifier 130 and DC/DC converter 140 to fall within a predetermined target voltage. Further, during traveling of the vehicle, vehicular ECU 180 controls PCU 160 based on a traveling state of the vehicle or a state of charge (also referred to as "SOC") of power storage device 150.

Further, vehicular ECU 180 receives a detection value of the voltage of secondary resonant coil 110 detected by voltage detector 190. Based on the detected voltage, vehicular ECU 180 determines whether or not there is a malfunction in secondary resonant coil 110. Then, vehicular ECU 180 provides alarming device 195 with a control signal indicating that there is a malfunction in secondary resonant coil 110 or a control signal indicating that there is no malfunction therein.

If vehicular ECU 180 determines that there is a malfunction in secondary resonant coil 110, vehicular ECU 180 sends a command to power supply device 200 through communication so as to restrict the supply of electric power or stop the supply of electric power, for example. Instead of or in addition to the above operation, vehicular ECU 180 stops the power receiving operation by stopping DC/DC converter 140 or changing the resonance frequency of the secondary resonant coil using an impedance adjuster not shown in the figure and provided for secondary resonant coil 110.

Based on the control signal from vehicular ECU 180, alarming device 195 notifies an operator of presence/absence of the malfunction in secondary resonant coil 110. Examples of alarming device 195 include: an alarming device audibly notifying of presence/absence of the malfunction, such as a buzzer or a chime; and an alarming device visually notifying of presence/absence of the malfunction, such as a lamp, an indicating light, or a liquid crystal display.

Temperature sensor 196 detects an outside air temperature external to the vehicle, and sends a detection result thereof to vehicular ECU 180.

Meanwhile, power supply device 200 includes an alternating-current power source 210, a high-frequency power driver 220, a primary electromagnetic induction coil 230, primary resonant coil 240, a voltage detector 250, power transmission ECU 260, and an alarming device 270.

Alternating-current power source 210 is a power source external to the vehicle, such as a commercial power source. High-frequency power driver 220 receives electric power from alternating-current power source 210, converts it to high-frequency electric power, and supplies the converted high-frequency electric power to primary electromagnetic induction coil 230. It should be noted that the high-frequency electric power generated by high-frequency power driver 220 has a frequency of, for example, 1 MHz to several ten MHz.

Primary electromagnetic induction coil 230 is provided coaxial to primary resonant coil 240, and can be magnetically coupled to primary resonant coil 240 through electromagnetic induction. By means of electromagnetic induction, primary electromagnetic induction coil 230 supplies primary resonant coil 240 with the high-frequency electric power supplied from high-frequency power driver 220.

Primary resonant coil 240 is provided in the vicinity of a ground surface, for example. As with secondary resonant coil 110, primary resonant coil 240 is an LC resonant coil whose both ends are open (connectionless), and is resonated with secondary resonant coil 110 of vehicle 100 via an electromagnetic field, thereby transmitting electric power to vehicle 100. It should be noted that the capacitance component of primary resonant coil 240 is also a parasitic capacitance of the coil, but as with secondary resonant coil 110, an additional capacitor (not shown) may be connected across the coil.

The number of winding of this primary resonant coil 240 is also appropriately set based on the distance to secondary resonant coil 110 of vehicle 100, the resonance frequencies of primary resonant coil 240 and secondary resonant coil 110, and the like, so as to obtain a large Q value (for example, Q>100), a large degree of coupling $\kappa$, and the like.

Voltage detector 250 is connected to primary resonant coil 240. Voltage detector 250 detects a voltage generated in primary resonant coil 240, and sends a detection value thereof to power transmission ECU 260. Details of the configuration of voltage detector 250 will be described below with reference to FIG. 6.

Although not shown in FIG. 1, power transmission ECU 260 includes a CPU (Central Processing Unit), a memory device, and an input/output buffer so as to control power supply device 200. Further, power transmission ECU 260 is configured to be capable of communicating with vehicular ECU 180 of vehicle 100 in a wireless manner or the like. It should be noted that processing for these controls is not limited to software processing, and can be implemented by dedicated hardware (electronic circuit).

Based on a type of vehicle 100 or a state of charge therein, power transmission ECU 260 controls electric power to be supplied from high-frequency power driver 220 to vehicle 100.

Further, power transmission ECU 260 receives a detection value of the voltage of primary resonant coil 240 detected by voltage detector 250. Based on this detected voltage, power transmission ECU 260 determines whether or not there is a malfunction in primary resonant coil 240. Then, power transmission ECU 260 provides alarming device 270 with a control signal indicating that there is a malfunction in primary resonant coil 240 or a control signal indicating that there is no malfunction therein.

If power transmission ECU 260 determines that there is a malfunction in primary resonant coil 240, power transmission ECU 260 controls high-frequency power driver 220 to restrict the supply of electric power or stop the supply of electric power, for example.

Based on the control signal from power transmission ECU 260, alarming device 270 notifies an operator of presence/absence of the malfunction in primary resonant coil 240. Examples of alarming device 270 include: an alarming device audibly notifying of presence/absence of the malfunction, such as a buzzer or a chime; and an alarming device visually notifying of presence/absence of the malfunction, such as a lamp, an indicating light, or a liquid crystal display.

Temperature sensor 280 detects an outside air temperature external to the vehicle, and sends a detection result thereof to power transmission ECU 260.

It should be noted that in the contactless power supply system of FIG. 1, both vehicle 100 and power supply device 200 include the voltage sensors for detecting the voltages of the resonant coils, and the alarming devices for providing the notifications of the malfunctions in the resonant coils respectively, but a voltage sensor and an alarming device may be provided in only one of vehicle 100 and power supply device 200.

Figure 2:
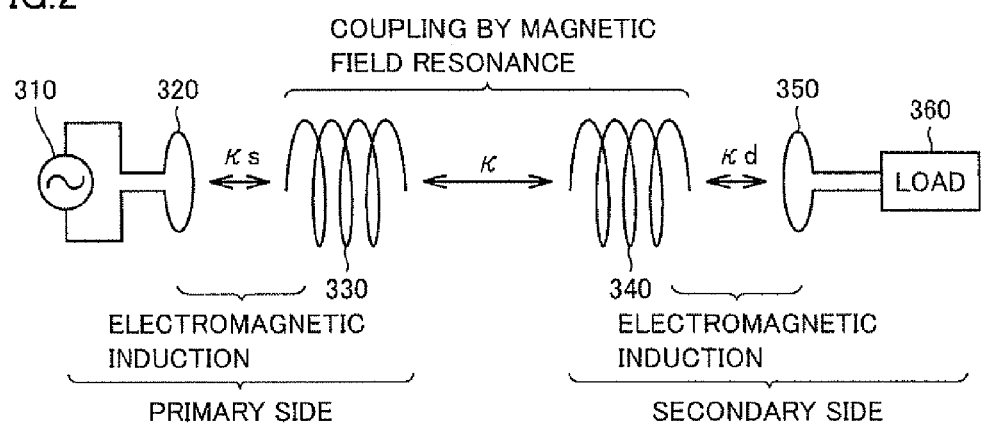
FIG. 2 illustrates a principle of transmitting electric power using a resonance method.

FIG. 2 illustrates a principle of transmitting electric power using the resonance method. Referring to FIG. 2, in this resonance method, in a manner similar to resonance between two tuning forks, two LC resonant coils having the same natural frequency are resonated in an electromagnetic field (near field), whereby electric power is transferred from one coil to the other coil via the electromagnetic field.

Specifically, a primary electromagnetic induction coil 320 is connected to a high-frequency power source 310. Then, high-frequency electric power of 1 MHz to several ten MHz is supplied by means of electromagnetic induction to a primary resonant coil 330, which is magnetically coupled to primary electromagnetic induction coil 320. Primary resonant coil 330 is an LC resonator having inductance of the coil itself and parasitic capacitance (inclusive of capacitance of a capacitor when the capacitor is connected to the coil), and is resonated with a secondary resonant coil 340 via an electromagnetic field (near field). Secondary resonant coil 340 has the same resonance frequency as that of primary resonant coil 330. Accordingly, energy (electric power) is transferred from primary resonant coil 330 to secondary resonant coil 340 via the electromagnetic field. The energy (electric power) thus transferred to secondary resonant coil 340 is extracted through electromagnetic induction by a secondary electromagnetic induction coil 350, which is magnetically coupled to secondary resonant coil 340. The energy (electric power) thus extracted is supplied to a load 360. It should be noted that the electric power transmission employing the resonance method is achieved when the Q value, which indicates a resonance strength between primary resonant coil 330 and secondary resonant coil 340, is more than 100, for example.

With regard to correspondence to FIG. 1, alternating-current power source 210 and high-frequency power driver 220 in FIG. 1 correspond to high-frequency power source 310 in FIG. 2. Primary electromagnetic induction coil 230 and primary resonant coil 240 in FIG. 1 respectively correspond to primary electromagnetic induction coil 320 and primary resonant coil 330 in FIG. 2. Secondary resonant coil 110 and secondary electromagnetic induction coil 120 in FIG. 1 respectively correspond to secondary resonant coil 340 and secondary electromagnetic induction coil 350 in FIG. 2. Components from rectifier 130 to motor 170 in FIG. 1 are collectively represented as load 360.

Figure 3:
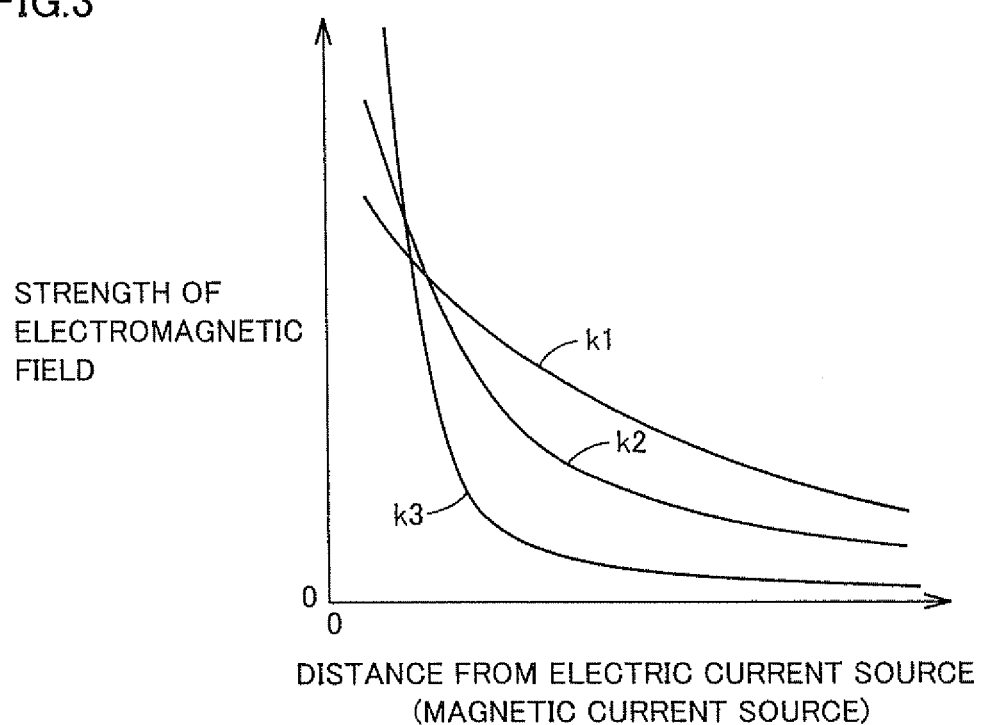
FIG. 3 shows a relation between a distance from an electric current source (magnetic current source) and strength of an electromagnetic field.

FIG. 3 shows a relation between a distance from the electric current source (magnetic current source) and strength of the electromagnetic field. Referring to FIG. 3, the electromagnetic field is constituted of three components. A line k1 represents a component in inverse proportion to the distance from the wave source, and is referred to as "radiation electromagnetic field". A line k2 represents a component in inverse proportion to the square of the distance from the wave source, and is referred to as "induced electromagnetic field". A line k3 represents a component in inverse proportion to the cube of the distance from the wave source, and is referred to as "electrostatic magnetic field".

The "electrostatic magnetic field" is a region in which the strength of the electromagnetic field is abruptly decreased as the distance is further away from the wave source. In the resonance method, a near field (evanescent field), in which this "electrostatic magnetic field" is dominant, is utilized for transfer of energy (electric power). Namely, in the near field in which the "electrostatic magnetic field" is dominant, a pair of resonators (for example, a pair of LC resonant coils) having the same natural frequency are resonated with each other, thereby transferring energy (electric power) from one resonator (primary resonant coil) to the other resonator (secondary resonant coil). This "electrostatic magnetic field" does not propagate energy to a distant place. Hence, the resonance method allows for electric power transmission with less energy loss as compared with the electromagnetic field in which the "radiation electromagnetic field" propagating energy to a distance place is utilized to transfer energy (electric power).

Figure 4:
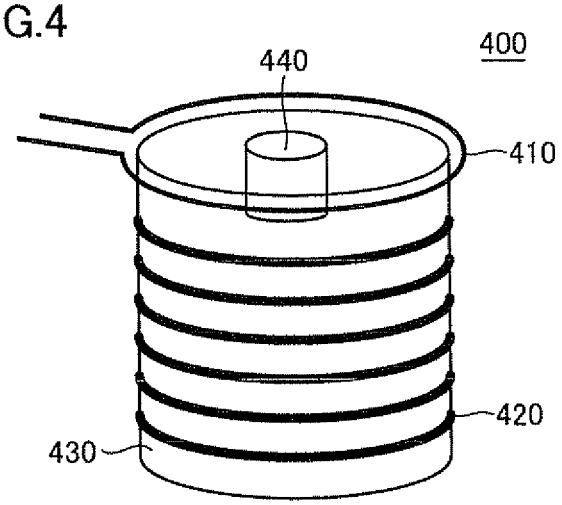
FIG. 4 is a schematic view of a coil unit.

FIG. 4 shows a schematic view of an exemplary coil unit 400 in the present embodiment. Referring to FIG. 4, coil unit 400 includes an electromagnetic induction coil 410, a resonant coil 420, a bobbin 430, and a capacitor 440.

Electromagnetic induction coil 410 corresponds to each of primary electromagnetic induction coil 230 and secondary electromagnetic induction coil 120 in FIG. 1. Further, resonant coil 420 corresponds to each of primary resonant coil 240 and secondary resonant coil 110 in FIG. 1.

Electromagnetic induction coil 410 is provided such that a coil material is wound around bobbin 430, which is circular and insulative. Then, electromagnetic induction coil 410 is disposed coaxial to resonant coil 420. Both ends of electromagnetic induction coil 410 are drawn to get out of a coil casing (not shown) containing coil unit 400 therein, and are connected to the external power source or the load. Thus, electromagnetic induction coil 410 transmits or receives electric power to or from resonant coil 420 by means of electromagnetic induction.

Resonant coil 420 is provided such that a coil material is wound around bobbin 430. Both coil ends of resonant coil 420 are connected to capacitor 440 provided in bobbin 430, thereby constituting an LC resonance circuit. It should be noted that capacitor 440 is not necessarily required. In the case where a desired capacitance component is achieved by the parasitic capacitance of resonant coil 420, both the ends of resonant coil 420 are adapted to be connectionless (open).

When resonant coil 420 is electromagnetically resonated with the other resonant coil opposite thereto, thereby transferring electric power. Further, resonant coil 420 exchanges electric power with electromagnetic induction coil 410 by means of electromagnetic induction.

As described above, in the transfer of electric power using the resonance method, a larger electric power (for example, of several kW) can be transferred to a more distant place in a contactless manner, as compared with the case of using the electromagnetic induction. However, such a large electric power generated in the resonant coil might lead to a system failure caused by heat generation or the like in the resonant coil. To address this, it is required to detect a malfunction in the resonant coil in order to prevent such a failure.

In general, for detection of a temperature of a coil, there might be employed a method of directly detecting the temperature of the coil using a contact type temperature sensor such as a thermistor or a thermocouple, for example. However, in the resonance method, when such a temperature sensor is brought into contact with the resonant coil or is disposed in the vicinity of the resonant coil, a parasitic capacitance between the resonant coil and the temperature sensor causes a change in resonance frequency of the resonant coil, or causes a current to flow in the temperature sensor to result in deteriorated Q value. Accordingly, the resonance state is likely to be influenced.

Meanwhile, a contactless type temperature sensor employing an optical fiber or a laser has been also known generally, and such a temperature sensor can be employed. However, such a sensor is relatively expensive to possibly result in increased cost.

In view of these, the present embodiment employs a method for determining a malfunction in the resonant coil based on a voltage applied to the resonant coil and detected using a voltage detector having less influence over the resonance state. The following describes details thereof.

Figure 5:
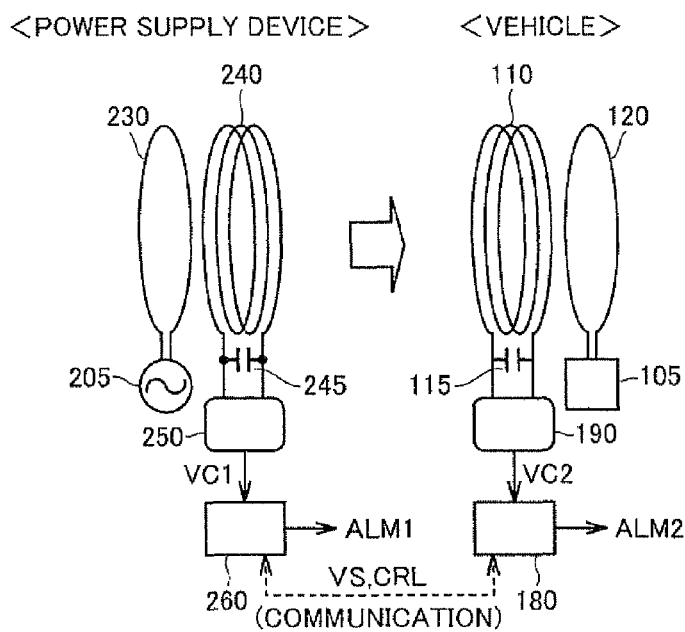
FIG. 5 illustrates a configuration for detecting a malfunction in a resonant coil in the present embodiment.

FIG. 5 illustrates a gist of detecting a malfunction of the resonant coil in the present embodiment. It should be noted that the same elements as those in FIG. 1 are not described repeatedly.

Referring to FIG. 5, a high-frequency power source 205, which corresponds to alternating-current power source 210 and high-frequency power driver 220 in FIG. 1, is connected to primary electromagnetic induction coil 230.

As required, a capacitor 245 for adjusting the resonance frequency is connected across primary resonant coil 240.

Voltage detector 250, which is connected across capacitor 245, detects a voltage applied to capacitor 245, i.e., a voltage applied to primary resonant coil 240. Then, voltage detector 250 sends a signal VC1 associated with the voltage applied to primary resonant coil 240, to power transmission ECU 260.

Power transmission ECU 260 compares signal VC1 with a reference voltage so as to determine whether or not the temperature of primary resonant coil 240 is greater than a permissible temperature as described below. Further, power transmission ECU 260 compares signal VC1 with a signal VS associated with a voltage of the transmitted electric power supplied from high-frequency power source 205, so as to determine whether or not the Q value between primary resonant coil 240 and secondary resonant coil 110 is decreased. If power transmission ECU 260 determines that at least one of these malfunctions is occurring, power transmission ECU 260 sends a malfunction signal ALM1 to alarming device 270 so as to notify the operator of the occurrence of malfunction.

As required, a capacitor 115 for adjusting the resonance frequency is connected across secondary resonant coil 110 of the vehicle 100 side.

Voltage detector 190, which is connected across capacitor 115, detects a voltage applied to capacitor 115, i.e., a voltage applied to secondary resonant coil 110. Then, voltage detector 190 sends a signal VC2 associated with the voltage applied to secondary resonant coil 110, to vehicular ECU 180.

Vehicular ECU 180 compares signal VC2 with a reference voltage so as to determine whether or not the temperature of secondary resonant coil 110 is greater than a permissible temperature. Further, vehicular ECU 180 compares signal VC2 with signal VS associated with the voltage of the transmitted electric power and transferred from power transmission ECU 260, so as to determine whether or not the Q value between primary resonant coil 240 and secondary resonant coil 110 is decreased. If vehicular ECU 180 determines that at least one of these malfunctions is occurring, vehicular ECU 180 sends a malfunction signal ALM2 to alarming device 195 so as to notify the operator of the occurrence of malfunction.

The following describes a detailed configuration of each of voltage detectors 190, 250.

Figure 6:
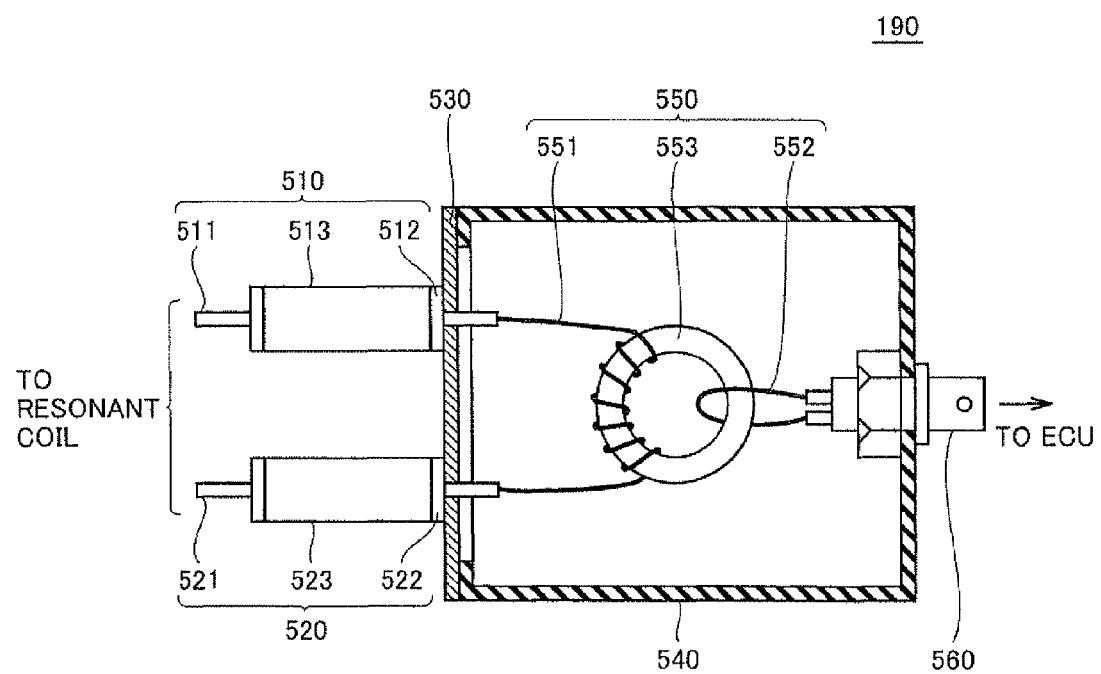
FIG. 6 is a schematic view of a voltage detector according to the present embodiment.

FIG. 6 is a schematic view of each of voltage detectors 190, 250 according to the present embodiment. It should be noted that FIG. 6 exemplifies and illustrates voltage detector 190 of the vehicle 100 side. Voltage detector 250 in the power supply device 200 side has basically the same configuration as that of voltage detector 190 described below, and is therefore not described repeatedly.

Referring to FIG. 5 and FIG. 6, voltage detector 190 includes: capacitors 510, 520; an isolation transformer 550; a coaxial connector 560, which is one example of an output terminal; and a shield box 540 containing isolation transformer 550 therein.

One end of capacitor 510 and one end of capacitor 520 are respectively connected to both the ends of secondary resonant coil 110. When secondary resonant coil 110 is connected to capacitor 115 for adjustment of the resonance frequency as shown in FIG. 5, capacitors 510, 520 are respectively connected to the ends of capacitor 115. Further, the other end of capacitor 510 and the other end of capacitor 520 are connected to the primary side (input side) of isolation transformer 550.

Capacitor 510 includes: an electrode 511 for achieving connection to secondary resonant coil 110; an electrode 512 for achieving connection to isolation transformer 550; and a dielectric member 513 provided between electrodes 511, 512. Likewise, capacitor 520 includes: an electrode 521 for achieving connection to secondary resonant coil 110; an electrode 522 for achieving connection to isolation transformer 550; and a dielectric member 523 provided between electrodes 521, 522.

Each of capacitors 510, 520 functions as an attenuator for dividing a high voltage generated in secondary resonant coil 110, so as to reduce a voltage to be applied to isolation transformer 550. Hence, it is preferable to make the capacitances of capacitors 510, 520 small enough to fall within a range where the breakdown voltage of isolation transformer 550 can be sufficiently reduced and the voltage change can be detected (i.e., high impedance is achieved).

It should be noted that impedance of the entire isolation transformer 550 is set smaller than that of each of capacitors 510, 520, but the impedance of the entire isolation transformer 550 relative to the impedance of each of capacitors 510, 520 is set based on an attenuation ratio required for a subsequent electronic circuit connected to coaxial connector 560 serving as an output terminal.

Further, capacitors 510, 520 are preferably formed such that each of the lengths of dielectric members 513, 523 in the electric field direction (i.e., a distance between the electrodes in each of them) is larger than the width of each electrode (i.e., length of the electrode perpendicular to the electric field direction). In other words, each of capacitors 510, 520 preferably has an elongated shape in which each electrode has a small area and the dielectric member is long in length. This is due to the following reason. That is, by setting the distance between isolation transformer 550 of voltage detector 190 and secondary resonant coil 110 as long as possible, a parasitic capacitance generated between shield box 540 and a connection point of isolation transformer 550 and each of capacitors 510, 520, and a parasitic capacitance generated between shield box 540 and each of the ends of secondary resonant coil 110 are reduced as small as possible (i.e., the impedance is made high), thereby reducing influence of secondary resonant coil 110 over the Q value. The parasitic capacitances are generated by connecting capacitors 510, 520 to secondary resonant coil 110. This also provides an effect of preventing creeping discharge, which is discharge along each of surfaces of dielectric members 513, 523.

Electrodes 512, 522 of capacitors 510, 520 at the isolation transformer 550 side are fixed to a terminal board 530. Terminal board 530 is an insulator and constitutes a part of shield box 540 containing isolation transformer 550 therein as described below. Alternatively, terminal board 530 can be of an electromagnetic shielding material in order to suppress the influence of electromagnetic field from secondary resonant coil 110. In this case, a material having high resistivity and high magnetic permeability is suitable to prevent short circuit between electrodes 512, 522.

Isolation transformer 550 includes a primary coil 551, a secondary coil 552, and a toroidal core 553.

Primary coil 551 is wound around toroidal core 553, and has ends respectively connected to electrodes 512, 522 of capacitors 510, 520. Secondary coil 552 is wound around toroidal core 553, and has ends respectively connected to the terminals of coaxial connector 560 serving as an output terminal fixed to shield box 540. With such a configuration, coaxial connector 560 and secondary resonant coil 110 are electrically insulated from each other. Further, as required, by changing a ratio of the number of winding of primary coil 551 and the number of winding of secondary coil 552, the input voltage received by primary coil 551 may be converted into a desired voltage.

For electrodes 511, 521 connected to secondary resonant coil 110 as shown in FIG. 6, elements constituting voltage detector 190 are preferably arranged such that the parasitic capacitances are symmetrical to each other. In other words, the elements are disposed such that the parasitic capacitance generated between shield box 540 and the connection point of capacitor 510 and isolation transformer 550, and the parasitic capacitance generated between shield box 540 and the connection point of capacitor 520 and isolation transformer 550 are symmetrical to each other. The elements are also disposed such that the parasitic capacitance generated between one end of secondary resonant coil 110 and shield box 540, and the parasitic capacitance generated between the other end of secondary resonant coil 110 and shield box 540 are symmetrical to each other. With this, a balanced differential voltage can be output, thus attaining an effect of simplifying the process in vehicular ECU 180. Hence, it is preferable that the capacitances of capacitors 510, 520 are designed to be substantially the same capacitance value.

Further, the elements constituting voltage detector 190 are contained in shield box 540 in order to suppress influence of the electromagnetic field generated from secondary resonant coil 110.

Coaxial connector 560 is connected to vehicular ECU 180 by a coaxial cable (not shown), and supplies vehicular ECU 180 with a signal associated with the voltage detected in secondary coil 552 and applied to secondary resonant coil 110.

Basically, voltage detector 190 may have any configuration as long as voltage detector 190 is configured to have the following functions: a function of dividing the voltage applied to secondary resonant coil 110 (the function corresponding to capacitors 510, 520); and a function of electrically insulating secondary resonant coil 110 and vehicular ECU 180 from each other (the function corresponding to the isolation transformer).

For example, instead of capacitors 510, 520, cables each having a high resistance and a long length can be employed to divide the voltage. However, in such a configuration, resistance components connected in series with secondary resonant coil 110 are increased, inductance is increased, and a parasitic capacitance between each cable and secondary resonant coil 110 is increased due to this long cable, with the result that the resonance state of secondary resonant coil 110 is likely to be influenced or the detector is likely to be required to have a large size to deal with heat generated by the resistance components. Further, it is also conceivable to directly connect a transformer having a large step-down ratio to secondary resonant coil 110. However, in such a case, the input impedance of the entire voltage detecting circuit is less likely to be decreased, so that occurrence of partial discharge between the winding wires of the transformer might be suppressed. Accordingly, countermeasures to these may be additionally required.

Thus, by employing the configuration of the voltage detector as illustrated in FIG. 6, the influence over the resonance state between the resonant coils whose voltages are measured can be reduced. Further, the use of the capacitors allows for decrease of the voltage while suppressing heat generation, thereby achieving downsizing of the voltage detector itself while suppressing increase of cost. Further, because the parasitic capacitance of the voltage detecting circuit is reduced, common mode noise and normal mode noise in the voltage detecting circuit can be reduced.

The following describes detection of a malfunction in the resonant coil by means of this voltage detector.

Figure 7:
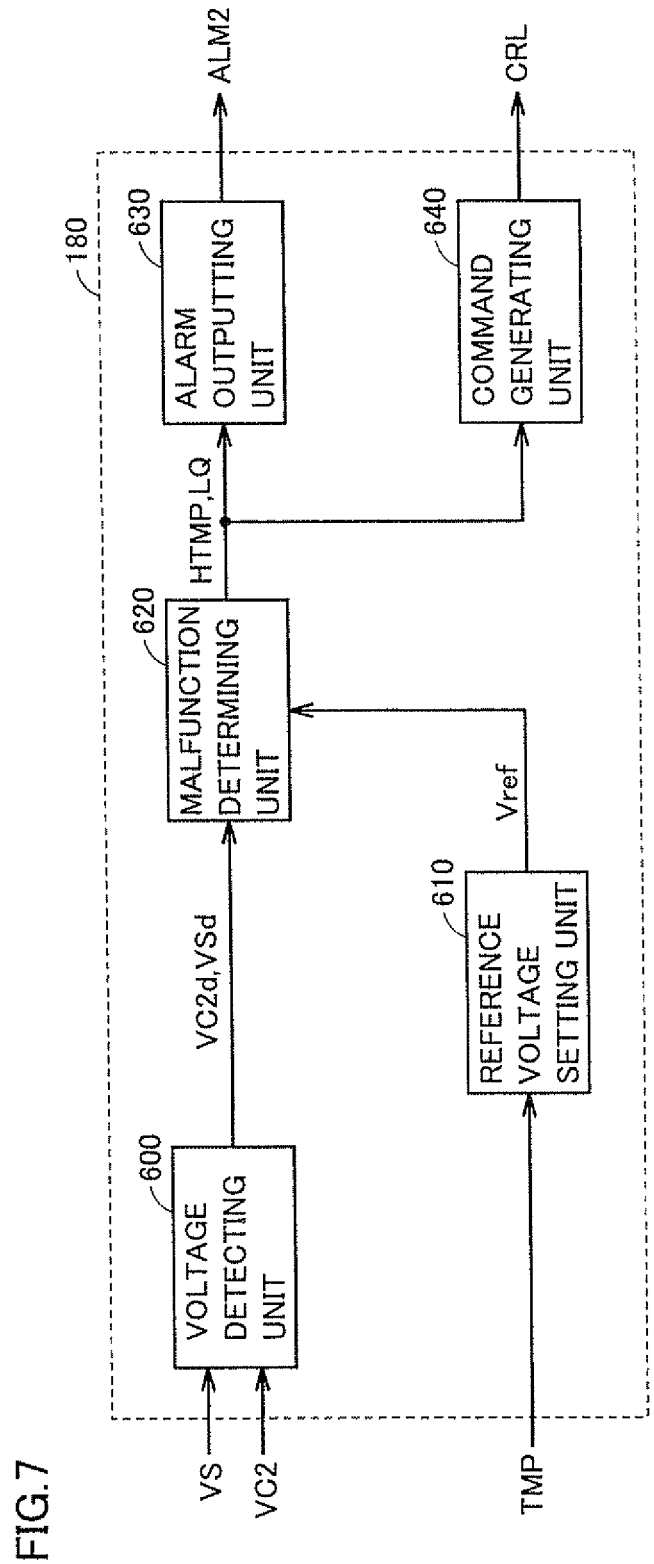
FIG. 7 is a function block diagram for illustrating malfunction detection control for the resonant coil in the present embodiment.

FIG. 7 is a function block diagram for illustrating malfunction detection control for the resonant coil in the present embodiment. Each of functional blocks shown in the function block diagram illustrated by FIG. 7 are implemented by vehicular ECU 180 and power transmission ECU 260 performing hardware processing or software processing. It should be noted that in FIG. 7 as well as FIG. 8 and FIG. 9 described below, control performed by vehicular ECU 180 of vehicle 100 is exemplified and illustrated, but control performed by power transmission ECU 260 of power supply device 200 can be performed basically in the same manner and is therefore not described repeatedly.

Referring to FIG. 5 and FIG. 7, vehicular ECU 180 includes a voltage detecting unit 600, a reference voltage setting unit 610, a malfunction determining unit 620, an alarm outputting unit 630, and a command generating unit 640.

Voltage detecting unit 600 receives signal VC2 (alternating-current signal) indicating a voltage corresponding to the voltage detected by voltage detector 190 and applied to secondary resonant coil 110, and signal VS (alternating-current signal) associated with the voltage of the transmitted power received from power supply device 200. Voltage detecting unit 600 rectifies these signals, and adjusts gains thereof as required, so as to generate voltage signals VC2$d$, VSd (direct-current signals), and sends them to malfunction determining unit 620.

Reference voltage setting unit 610 receives an outside air temperature TMP detected by temperature sensor 196. Based on this outside air temperature TMP, reference voltage setting unit 610 sets a reference voltage Vref permitted by secondary resonant coil 110, and sends it to malfunction determining unit 620.

Here, the following briefly describes the setting of reference voltage Vref in reference voltage setting unit 610. In general, the resonant coil generates heat in proportion to the resistance component of the resonant coil and the square of current flowing in the resonant coil. The current flowing in the resonant coil is in proportion to the voltage applied to the resonant coil. Then, the steady-state value of the temperature of the resonant coil can be presumed from the ambient temperature (i.e., outside air temperature) and temperature increase resulting from heat generation of the resonant coil. When the outside air temperature is high for example, an amount of temperature increase till the permissible temperature of the coil needs to be restricted to be smaller than that when the outside air temperature is low. Thus, reference voltage Vref corresponding to the permissible amount of generated heat in the resonant coil at the outside air temperature at the present moment can be set using, for example, a map, etc., indicating a relation between the voltage applied to the secondary resonant coil and the temperature of the secondary resonant coil at the moment of application thereof as determined by experiment or the like in advance.

Malfunction determining unit 620 receives direct-current voltages VC2$d$, VSd from voltage detecting unit 600 and receives reference voltage Vref from reference voltage setting unit 610.

Malfunction determining unit 620 compares voltage VC2$d$ with reference voltage Vref. If voltage VC2$d$ is greater than reference voltage Vref, malfunction determining unit 620 determines that secondary resonant coil 110 has a temperature equal to or greater than the permissible temperature. Then, malfunction determining unit 620 generates a high-temperature signal HTMP indicating that the resonant coil has a high temperature, and sends it to alarm outputting unit 630 and command generating unit 640. The setting of reference voltage Vref by reference voltage setting unit 610 is not limited to the setting made in accordance with the permissible temperature of secondary resonant coil 110 as described above. Instead of or in addition to this, other reference voltages may be set to detect breakdown voltage of capacitor 115 for resonance, dielectric voltage of secondary resonant coil 110, and the like. It should be noted that in this malfunction detection technique, it is difficult to detect such a malfunction that the voltage of the resonant coil is decreased.

Further, malfunction determining unit 620 compares voltage VC2$d$ with voltage VSd. If voltage VC2$d$ is smaller than voltage VSd, malfunction determining unit 620 determines that the Q value is decreased due to poor insulation of the resonant circuit constituted of secondary resonant coil 110 and capacitor 115, approach of devices other than the resonant circuit (or a dielectric member, a magnetic member, etc.), i.e., determines that loss by the resonant circuit is increased. Then, malfunction determining unit 620 generates a Q value decrease signal EQ indicating that the Q value has been decreased, and sends it to alarm outputting unit 630 and command generating unit 640.

From malfunction determining unit 620, alarm outputting unit 630 receives the signals indicating the malfunctions, such as high-temperature signal HTMP and Q value decrease signal LQ. When a malfunction is occurring, alarm outputting unit 630 sends alarm signal ALM2 to alarming device 195 so as to notify the operator of the occurrence of malfunction.

From malfunction determining unit 620, command generating unit 640 receives the signals indicating the malfunctions, such as high-temperature signal HTMP and Q value decrease signal LQ. Further, in accordance with a state of the malfunction, command generating unit 640 generates a control signal CRL for instructing power supply device 200 to change (increase or decrease) electric power to be supplied from power supply device 200 or instructing power supply device 200 to stop supplying the electric power, or for stopping DC/DC converter 140 of vehicle 100, and sends it to power supply device 200, DC/DC converter 140, and the like.

Figure 8:
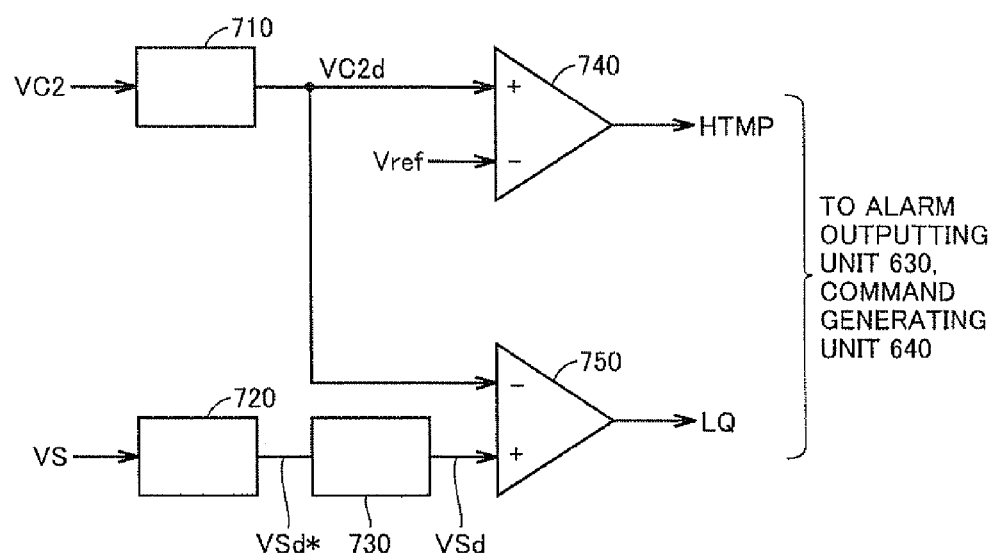
FIG. 8 shows one example of a malfunction detecting circuit for the resonant coil.

FIG. 8 shows one example of constructing each of voltage detecting unit 600 and malfunction determining unit 620 illustrated in the function block diagram of FIG. 7, using an analog circuit.

Referring to FIG. 7 and FIG. 8, vehicular ECU 180 includes rectifying circuits 710, 720, a gain adjusting unit 730, and comparators 740, 750. Among them, rectifying circuits 710, 720 and gain adjusting unit 730 represent one example of voltage detecting unit 600 in FIG. 7, and comparators 740, 750 represent one example of malfunction determining unit 620 in FIG. 7.

Rectifying circuit 710 rectifies voltage VC2, which is an alternating-current signal received from voltage detector 190, into VC2$d$, which is a direct-current signal. Then, rectifying circuit 710 sends signal VC2$d$ to positive input terminals of comparators 740, 750.

Comparator 740 compares signal VC2$d$ thus rectified by rectifying circuit 710 with reference voltage Vref received at a negative input teiininal of comparator 740. If signal VC2$d$ is greater than reference voltage Vref, comparator 740 sends high-temperature signal HTMP to alarm outputting unit 630 and command generating unit 640.

Rectifying circuit 720 rectifies voltage VS, which is an alternating-current signal transmitted from power transmission ECU 260, into VSd*, which is a direct-current signal. Gain adjusting unit 730 generates a signal VSd by multiplying direct-current signal VSd* from rectifying circuit 720 by a predetermined gain, and sends signal VSd to a negative input terminal of comparator 750.

Comparator 750 compares signal VC2$d$ rectified by rectifying circuit 710, with signal VSd sent from gain adjusting unit 730. If signal VC2$d$ is smaller than signal VSd, comparator 750 sends Q value decrease signal LQ to alarm outputting unit 630 and command generating unit 640.

It should be noted that FIG. 8 illustrates the circuit constructed by an analog circuit, but at least a part of the above-described functions may be implemented by digital signal processing (inclusive of hardware and software).

Figure 9:
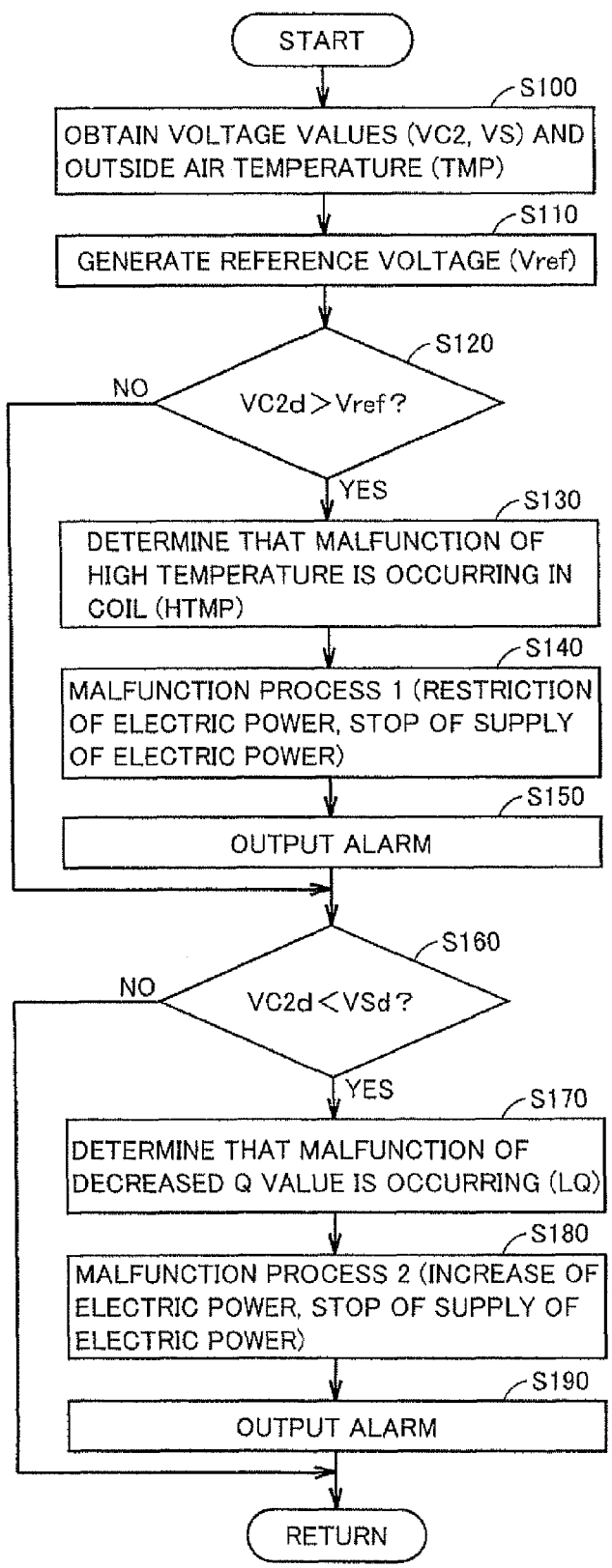
FIG. 9 is a flowchart for illustrating details of the malfunction detection control process for the resonant coil in the present embodiment.

FIG. 9 is a flowchart for illustrating details of the malfunction detection control process for the resonant coil in the present embodiment. Each of steps in the flowchart shown in FIG. 9 is implemented by invoking and executing a program, stored in advance in vehicular ECU 180, at a predetermined cycle from a main program. Alternatively, a part of the steps can be implemented by dedicated hardware (electronic circuit) constructed for the processing.

Referring to FIG. 9, in a step (hereinafter, the term "step" will be abbreviated as "S") 100, vehicular ECU 180 obtains signal VC2, signal VS, and outside air temperature TMP. Signal VC2 is associated with the voltage of secondary resonant coil 110. Signal VS is associated with the voltage of the electric power transmitted from power supply device 200. Further, from signals VC2, VS, which are alternating-current signals, vehicular ECU 180 respectively calculates signals VC2$d$, VSd, which are direct-current signals.

Next, in S110, based on outside air temperature TMP, vehicular ECU 180 calculates reference voltage Vref. Then, in SI20, vehicular ECU 180 determines whether or not signal VC2$d$ is greater than reference voltage Vref.

When signal VC2$d$ is greater than reference voltage Vref (YES in S120), ECU 180 proceeds the process to S130, in which ECU 180 then determines that a high temperature malfunction is occurring in secondary resonant coil 110. Then, in S140, vehicular ECU 180 performs a malfunction process corresponding to the high temperature malfunction in the coil. Specifically, vehicular ECU 180 sends a command to power supply device 200 to decrease or stop supply of electric power, or stops DC/DC converter 140 to stop the power receiving operation. Alternatively, in the case where a cooling device (not shown) is provided to cool secondary resonant coil 110, the operation of supplying electric power may be continued while operating the cooling device.

Then, in S150, vehicular ECU 180 outputs an alarm to notify the operator that the high temperature malfunction is occurring in the coil, and proceeds the process to S160.

On the other hand, when signal VC2$d$ is equal to or smaller than reference voltage Vref (NO in S120), vehicular ECU 180 determines that secondary resonant coil 110 does not have a high temperature, skips the processes of S130-S150, and proceeds the process to S160.

In S160, vehicular ECU 180 determines whether or not signal VC2$d$ is greater than signal VSd.

When signal VC2$d$ is smaller than signal VSd (YES in S160), ECU 180 proceeds the process to S170, in which ECU 180 determines that a malfunction of decreased Q value is occurring. Then, in S180, vehicular ECU 180 performs a malfunction process corresponding to the malfunction of decreased Q value. Specifically, vehicular ECU 180 sends a command to power supply device 200 to increase supply of electric power in order to provide desired electric power, or stop the supply of electric power in order to suppress influence over other devices.

Then, in S190, vehicular ECU 180 outputs an alarm to notify the operator that the malfunction of decreased Q value is occurring.

On the other hand, when signal VC2d is equal to or greater than signal VSd (NO in S160), vehicular ECU 180 determines that the decrease of Q value is not occurring, skips the processes of S170-S190, and returns the process to the main routine.

By performing control in accordance with the above-described process using the voltage detector configured as described above, a malfunction in the resonant coil can be detected while suppressing influence over the resonance state between the resonant coils and suppressing increase of cost in the contactless power supply system employing the resonance method.

It should be noted that "capacitors 510, 520" in the present embodiment are respective examples of "first high-impedance element" and "second high-impedance element" in the present invention. "Isolation transformer 550" in the present embodiment is one example of "low-impedance element" in the present invention.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

Reference Signs List

100: vehicle; 110, 340: secondary resonant coil; 115, 245, 440, 510, 520: capacitor; 120, 350: secondary electromagnetic induction coil; 130: rectifier; 140: DC/DC converter; 150: power storage device; 160: PCU; 170: motor; 180: vehicular ECU; 190, 250: voltage detector; 195, 270: alarming device; 196, 280: temperature sensor; 200: power supply device; 205, 310: high-frequency power source; 210: alternating-current power source; 220: high-frequency power driver; 230, 320: primary electromagnetic induction coil; 240, 330: primary resonant coil; 260: power transmission ECU; 360: load; 400: coil unit; 410: electromagnetic induction coil; 420: resonant coil; 430: bobbin; 511, 512, 521, 522: electrode; 513, 523: dielectric member; 530: terminal board; 540: shield box; 550: isolation transformer; 551: primary coil; 552: secondary coil; 553: toroidal core; 560: coaxial connector; 600: voltage detecting unit; 610: reference voltage setting unit; 620: malfunction determining unit; 630: alarm outputting unit; 640: command generating unit; 710, 720: rectifying circuit; 730: gain adjusting unit; 740, 750: comparator.

The invention claimed is:

1. A voltage detector for detecting a voltage generated in a second resonant coil that is disposed to face a first resonant coil and that performs at least one of electric power transmission and electric power reception to and from said first resonant coil in a contactless manner by means of electromagnetic resonance, said voltage detector comprising:
a first high-impedance element having one end connected to one end of said second resonant coil:
a second high-impedance element having one end connected to the other end of said second resonant coil;
a low-impedance element connected between the other end of said first high-impedance element and the other end of said second high-impedance element and having an impedance smaller than each of those of said first and second high-impedance elements; and
an output terminal for outputting a signal associated with a voltage applied across said low-impedance element,
said first high-impedance element including a first capacitor, and
said second high-impedance element including a second capacitor.

2. The voltage detector according to claim 1, wherein each of said first and second capacitors includes
an electrode for achieving connection to said second resonant coil, and
a dielectric member whose length in an electric field direction is larger than that of said electrode in a direction perpendicular to said electric field direction.

3. The voltage detector according to claim 2, wherein the length of said dielectric member in said electric field direction is a length that allows an impedance of said voltage detector to be greater than a predetermined value large enough to have no influence over a resonance state between said first and second resonant coils, said impedance of said voltage detector being generated by connecting said first and second capacitors to said second resonant coil.

4. The voltage detector according to claim 1, wherein capacitances of said first and second capacitors are set to be substantially equal to each other.

5. The voltage detector according to claim 1, wherein:
said low-impedance element is an isolation transformer, and
said isolation transformer includes
a primary coil connected between the respective other ends of said first and second high-impedance elements,
a secondary coil connected to said output terminal, and
a toroidal core around which said primary coil and said secondary coil are wound.

6. The voltage detector according to claim 5, further comprising a shield box for shielding an electromagnetic field generated from said second resonant coil, wherein
said isolation transformer is disposed in said shield box.

7. The voltage detector according to claim 1, wherein:
each of said first and second high-impedance elements includes an electrode for achieving connection to said second resonant coil and
said first and second high-impedance elements and said low-impedance element are arranged such that impedances respectively connected to said electrodes are symmetrical to each other.

8. A malfunction detecting device comprising:
the voltage detector recited in claim 1; and
a malfunction determining unit configured to determine a malfunction in said second resonant coil, based on the signal associated with the voltage and output from said voltage detector.

9. The malfunction detecting device according to claim 8, wherein when said signal associated with the voltage is greater than a reference value, said malfunction determining unit determines that said second resonant coil has a high temperature.

10. The malfunction detecting device according to claim 8, wherein said malfunction determining unit determines whether or not loss in said second resonant coil is increased, based on a comparison between said signal associated with the voltage and a voltage of the electric power supplied to said second resonant coil.

11. The malfunction detecting device according to claim 8, further comprising an alarm outputting unit for outputting an alarm to an operator when the malfunction in said second resonant coil is detected.

12. A contactless power transmitting device for transferring electric power from an power source to a power receiving device in a contactless manner by means of electromagnetic resonance, comprising:
a resonant coil for establishing electromagnetic resonance with said power receiving device;
an electromagnetic induction coil configured to transfer the electric power from said power source to said resonant coil by means of electromagnetic induction;
a voltage detector for detecting a voltage generated in said resonant coil; and
a malfunction determining unit configured to detect a malfunction in said resonant coil based on a signal associated with a voltage and output from said voltage detector,
said voltage detector including
a first high-impedance element having one end connected to one end of said resonant coil,
a second high-impedance element having one end connected to the other end of said resonant coil,
a low-impedance element connected between the other end of said first high-impedance element and the other end of said second high-impedance element and having an impedance smaller than each of those of said first and second high-impedance elements, and
an output terminal for outputting the signal associated with the voltage applied across said low-impedance element,
said first high-impedance element having a first capacitor, and
said second high-impedance element having a second capacitor.

13. A contactless power receiving device for receiving electric power from a power transmitting device in a contactless manner by means of electromagnetic resonance, comprising:
a resonant coil for establishing electromagnetic resonance with said power transmitting device;
an electromagnetic induction coil configured to extract the electric power received by said resonant coil, by means of electromagnetic induction;
a voltage detector for detecting a voltage generated in said resonant coil; and
a malfunction determining unit configured to detect a malfunction in said resonant coil based on a signal associated with the voltage and output from said voltage detector,
said voltage detector including
a first high-impedance element having one end connected to one end of said resonant coil,
a second high-impedance element having one end connected to the other end of said resonant coil,
a low-impedance element connected between the other end of said first high-impedance element and the other end of said second high-impedance element and having an impedance smaller than each of those of said first and second high-impedance elements, and
an output terminal for outputting the signal associated with the voltage applied across said low-impedance element
said first high-impedance element having a first capacitor, and
said second high-impedance element having a second capacitor.

14. A vehicle comprising:
a contactless power receiving device for receiving electric power from a power transmitting device in a contactless manner by means of electromagnetic resonance;
a power storage device capable of being charged using the electric power received by said contactless power receiving device; and
a driving device for generating driving power for traveling of said vehicle using the electric power from said power storage device,
said contactless power receiving device including
a resonant coil for establishing electromagnetic resonance with said power transmitting device,
an electromagnetic induction coil configured to extract electric power received by said resonant coil, by means of electromagnetic induction,
a voltage detector for detecting a voltage generated in said resonant coil, and
a malfunction determining unit configured to detect a malfunction in said resonant coil (110), based on a signal associated with the voltage and output from said voltage detector,
said voltage detector including
a first high-impedance element having one end connected to one end of said resonant coil,
a second high-impedance element having one end connected to the other end of said resonant coil,
a low-impedance element connected between the other end of said first high-impedance element and the other end of said second high-impedance element and having an impedance smaller than each of those of said first and second high-impedance elements, and
an output terminal for outputting the signal associated with the voltage applied across said low-impedance element,
said first high-impedance element having a first capacitor, and
said second high-impedance element having a second capacitor.

* * * * *